(12) United States Patent
Ma et al.

(10) Patent No.: US 9,391,584 B2
(45) Date of Patent: Jul. 12, 2016

(54) BALUN DEVICE

(71) Applicant: National Taiwan University of Science and Technology, Taipei (TW)

(72) Inventors: Tzyh-Ghuang Ma, Taipei (TW); Yi-Lung Wu, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 0 days.

(21) Appl. No.: 14/564,108

(22) Filed: Dec. 9, 2014

(65) Prior Publication Data

US 2015/0288343 A1    Oct. 8, 2015

(30) Foreign Application Priority Data

Apr. 7, 2014  (TW) .............................. 103112662 A
Jun. 10, 2014  (TW) .............................. 103120107 A

(51) Int. Cl.
*H03H 7/42* (2006.01)
*H03H 7/38* (2006.01)
*H01P 3/08* (2006.01)

(52) U.S. Cl.
CPC .. *H03H 7/42* (2013.01); *H03H 7/38* (2013.01)

(58) Field of Classification Search
CPC ............. H03H 7/42; H03H 7/422; H01P 3/08
USPC ............................................. 333/25, 26, 238
See application file for complete search history.

(56) References Cited

U.S. PATENT DOCUMENTS

| 6,531,943 B2* | 3/2003 | Niu .......................... H03H 7/42 333/25 |
| 7,205,861 B2 | 4/2007 | Inoue et al. |

(Continued)

FOREIGN PATENT DOCUMENTS

| CN | 1905377 B | 6/2012 |
| TW | I368352 | 7/2012 |
| TW | 201308747 | 2/2013 |
| TW | I404087 | 8/2013 |

OTHER PUBLICATIONS

Juan Enrique Page et al, Lattice equivalent circuits of transmission-line and coupled-line sections. IEEE Trans. Microwave Theory Tech., vol. 59, No. 10, pp. 2422-2430, Oct. 2011.

(Continued)

*Primary Examiner* — Dean Takaoka
(74) *Attorney, Agent, or Firm* — CKC & Partners Co., Ltd.

(57) ABSTRACT

A balun device is disclosed herein. The balun device is configured to transform a single-ended signal into a differential signal. The balun device includes a first and a second output port, an input port, and a matching circuit. The first output port includes a first output terminal. The second output port includes a second output terminal. The input port includes an input single-ended signal terminal and an input single-ended reference terminal. The input single-ended reference terminal is connected to the second output terminal, and the input single-ended signal terminal is configured to receive the single-ended signal which is relative to the input single-ended reference terminal. The matching circuit is connected to the first output port, the second output port and the input port and configured to transform the single-ended signal into the differential signal outputted between the first and the second output port with lowpass, highpass, or bandpass response.

10 Claims, 11 Drawing Sheets

(56) References Cited

U.S. PATENT DOCUMENTS

| | | | | |
|---|---|---|---|---|
| 8,076,993 | B2* | 12/2011 | Hamada | H01P 5/10 333/128 |
| 8,471,645 | B2* | 6/2013 | Ujita | H01P 5/10 333/238 |
| 8,564,382 | B2 | 10/2013 | Liu et al. | |
| 8,981,868 | B2* | 3/2015 | Lin | H01P 5/10 333/25 |
| 2009/0140823 | A1 | 6/2009 | Lee et al. | |

OTHER PUBLICATIONS

Frédéric Bongard et al, Enhanced CRLH transmission line performances using a lattice network unit cell. IEEE Microw. Wireless Compon. Lett., vol. 19, No. 7, pp. 431-433, Jul. 2009.

Robert C Frye et al, High CMRR in Reduced-Coupling Monolithic Baluns. 2010 IEEE MTT-S International.

Heng-Ming Hsu et al, Design of an On-Chip Balun With a Minimum Amplitude Imbalance Using a Symmetric Stack Layout. IEEE Trans. Microwave Theory Tech., vol. 58, pp. 814-819, Apr. 2010.

Kian Sen Ang et al, Analysis and design of impedance-transforming planar Marchand baluns. IEEE Trans. Microwave Theory and Tech., vol. 49, No. 2, pp. 402-406, Feb. 2001.

Tzyh-Ghuang MA et al, Miniaturized distributed Marchand balun using coupled synthesized CPWs. IEEE Microw. Wireless Compon. Lett., vol. 21, No. 4, pp. 188-190, Apr. 2011.

Yu Ye, Ling-Yun Li, Jian-Zhong Gu, and Xiao-Wei Sun, "A Bandwidth Improved Broadband Compact Lumped-Element 3alun With Tail Inductor", IEEE Microwave and Wireless Components Letters, vol. 23, No. 8, August 2013, pp. 415-417.

* cited by examiner

BALUN DEVICE

RELATED APPLICATIONS

This application claims priority to Taiwan Application Serial Number 103112662, filed Apr. 7, 2014, and Taiwan Application Serial Number 103120107, filed Jun. 10, 2014, which are herein incorporated by reference.

BACKGROUND

1. Field of Invention

The present disclosure relates to a balun device. More particularly, the present disclosure relates to a non-coupling balun device.

2. Description of Related Art

Typically, a balun device transforms between unbalanced signals and balanced signals, and is also referred to as an unbalanced-balanced converter a balanced-unbalanced converter. An unbalanced signal is called a single-ended signal, and a balanced signal is called a differential signal. Compared with a single-ended signal, a differential signal has better immunity to common-mode noise/radiation. As a result, a differential signal is commonly used in data transmission with a high transmission rate, e.g., USB 3.0, HDMI 1.4a, etc.

Traditionally, coupled inductors or transformers are used in a balun device. Such a design normally requires two or more inductors, and results in higher power loss and occupy a larger area in microwave circuits. As a result, those in the industry are endeavoring to design a balun device with a fewer number of inductors so as to lower down the overall power consumption, as well as the area occupied by the inductors.

SUMMARY

The disclosure provides a balun device. The balun device is configured to transform a single-ended signal into a differential signal. The balun device includes a first output port, a second output port, an input port, and a matching circuit. The first output port includes a first output terminal. The second output port includes a second output terminal. The input port includes an input single-ended signal terminal and an input single-ended reference terminal. The input single-ended reference terminal is electrically connected to the second output terminal, and the input single-ended signal terminal is configured to receive the single-ended signal which is relative to the input single-ended reference terminal. The matching circuit is electrically connected to the first output port, the second output port and the input port. The matching circuit is configured to transform the single-ended signal into the differential signal between the first output port and the second output port.

The disclosure provides a balun device disposed on a circuit board, in which the balun device is configured to transform a single-ended signal into a differential signal. The balun device includes an input single-ended signal metal layer, an input single-ended reference metal layer, a first output metal layer, a second output metal layer, a first passive component and a second passive component. The first passive component includes a first terminal and a second terminal. The second passive component includes a first terminal and a second terminal. The input single-ended signal metal layer is configured to receive the single-ended signal reference to the input single-ended reference metal layer. The second output metal layer is electrically connected to the input single-ended reference metal layer. The first terminal of the first passive component is electrically connected to the input single-ended metal layer, and the second terminal of the first passive component is electrically connected to the first output metal layer. The first terminal of the second passive component is electrically connected to the first output metal layer, and the second terminal of the second passive component is electrically connected to the second output metal layer. The first passive component and the second passive component are configured to transform and match the single-ended signal into the differential signal outputted between the first output metal layer and the second output metal layer.

The disclosure provides a balun device disposed on a circuit board, in which the balun device is configured to transform a single-ended signal into a differential signal. The balun device includes a input single-ended metal layer, a input single-ended reference metal layer, a first output metal layer, a second output metal layer, a first passive component and a second passive component. The first passive component includes a first terminal and a second terminal. The second passive component includes a first terminal and a second terminal. The input single-ended metal layer is configured to receive the single-ended signal reference to the input single-ended reference metal layer. The second output metal layer is electrically connected to the input single-ended reference metal layer. The first terminal of the first passive component is electrically connected to the input single-ended metal layer, and the second terminal of the first passive component is electrically connected to the second output metal layer. The first terminal of the second passive component is electrically connected to the input single-ended metal layer, and the second terminal of the second passive component is electrically connected to the first output metal layer. The first passive component and the second passive component are configured to transform and match the single-ended signal into the differential signal outputted between the first output metal layer and the second output metal layer.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
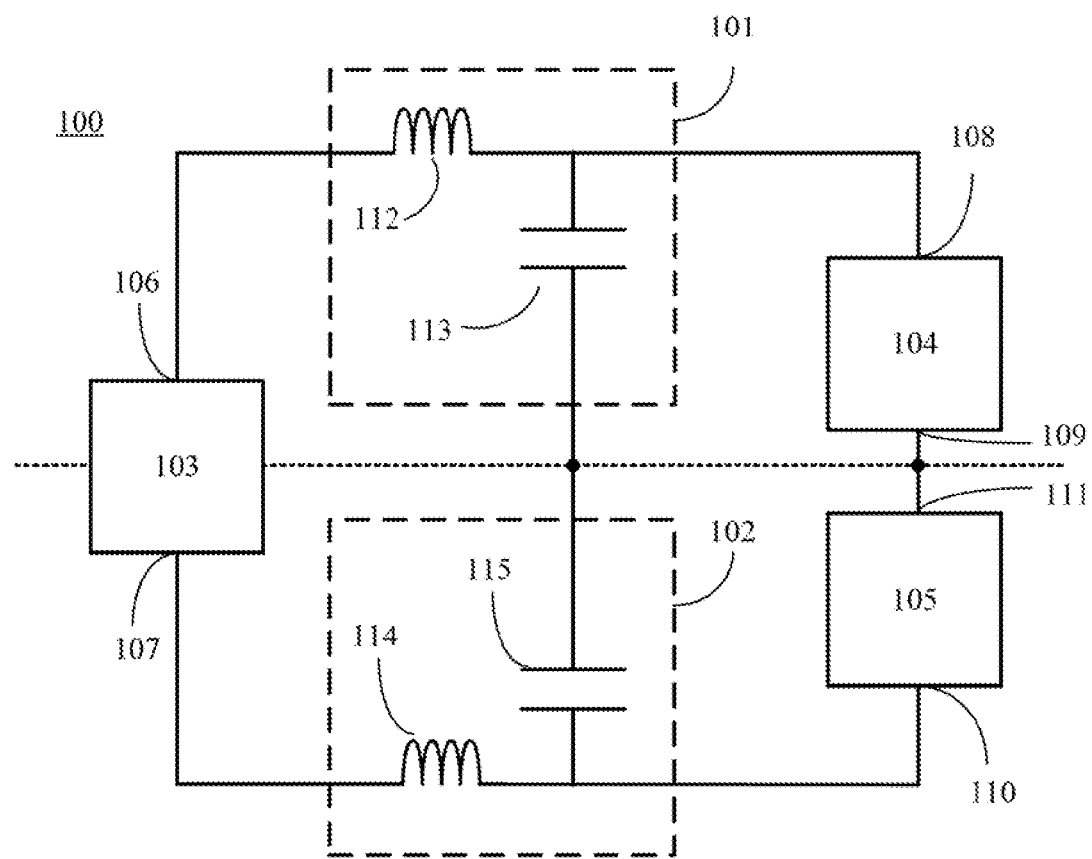
FIG. 1A is a schematic diagram illustrating a structure of a balun device according to one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

It will be understood that, although the terms "first," "second," "third," etc. may be used herein to describe various elements, components, layers and/or sections, these elements, components, layers and/or sections should not be limited by these terms. These terms are only used to distinguish one element, component, layer or section from another element, component, region, layer or section. Thus, a first element, component, layer or section discussed below could be termed a second element, component, layer or section without departing from the teachings of the present disclosure.

Referring to FIG. 1A, a schematic diagram illustrating a structure of a balun device 100 according to one embodiment of this disclosure is presented. The balun device 100 is configured to transform a single-ended signal into a differential signal. The balun device 100 includes a first matching circuit 101, a second matching circuit 102, an input port 103, a first output port 104 and a second output port 105. The input port 103 is electrically connected to the first matching circuit 101 and the second matching circuit 102. The first matching circuit 101 is electrically connected to the first output port 104 and the second matching circuit 102. The second matching circuit 102 is electrically connected to the second output port 105. The first output port 104 is electrically connected to the second output port 105.

The input port 103 includes an input single-ended signal terminal 106 and an input single-ended reference terminal 107. The input port 103 is configured to receive a single-ended signal. In more detail, the input single-ended signal terminal 106 of the input port 103 is configured to receive the single-ended signal relative to the input single-ended reference terminal 107.

The first output port 104 includes a first output terminal 108 and a first reference terminal 109. The first output port 104 is configured to output a first signal of the first matching circuit 101. The second output port 105 includes a second output terminal 110 and a second reference terminal 111. The second output port 105 is configured to output a second signal outputted by the second matching circuit 102. The differential signal is defined as a difference signal between the first signal and the second signal. On the other hand, the first reference terminal 109 is electrically connected to the second reference terminal 111 but not to the input single-ended reference terminal 107. In other words, the input port 103, the first output port 104 and the second output port 105 of the balun device are not referred to the same reference voltage level, e.g., a grounded voltage.

In some embodiments, the first output port 108 is configured to output the first signal relative to the first reference terminal 109, and the second output terminal 110 is configured to output the second signal relative to the second reference terminal 111.

The first matching circuit 101 includes an inductor 112 and a capacitor 113, and the second matching circuit 102 includes an inductor 114 and a capacitor 115. The first terminal of the inductor 112 and the first terminal of the inductor 114 are connected to the input single-ended signal terminal 106 and the input single-ended reference terminal 107 of the input port 103 respectively. The second terminal of the inductor 112 is electrically connected to the first output terminal 108 and the first terminal of the capacitor 113. The second terminal of the inductor 114 is electrically connected to the second output terminal 110 and the first terminal of the capacitor 115. The second terminal of the capacitor 113 is electrically connected to the second terminal of the capacitor 115. The first matching circuit 101 and the second matching circuit 102 are configured to match and transform the single-ended signal into the first signal and the second signal, in which the first signal is transmitted to the first output port 104, and the second signal is transmitted to the second output port 105.

In some embodiments, the second terminal of the capacitor 113 is electrically connected to the first reference terminal 109 and the second reference terminal 111.

Figure 1B:
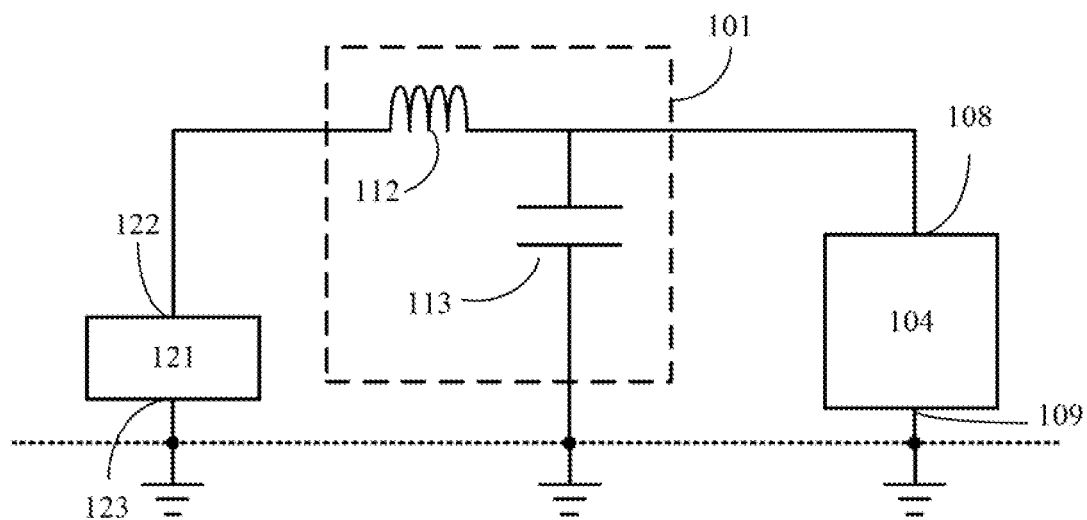
FIG. 1B is a circuit diagram illustrating an equivalent half circuit of the balun device of FIG. 1A.

It should be noted that the second terminal of the capacitor 113, the second terminal of the capacitor 115, the first reference terminal 109 of the first output port 104 and the second reference terminal 111 of the second output port 105 are virtual grounded since the balun device 100 is symmetric. Reference is also made to FIG. 1B which shows an equivalent circuit diagram illustrating the upper half circuit of the balun device 100. Utilizing half circuit analysis, the upper half circuit of the balun device 100 can be equivalently viewed as the circuit 120.

The circuit 120 includes an input port 121. The input port 121 includes a first terminal 122 and a second terminal 123, in which the impedance of the input port 121 can be considered to be half of the impedance of the input port 103. Since the second terminal of the input port 121, the second terminal of the capacitor 113 and the first reference terminal 109 of the first output port 104 are deemed grounded, the inductance of the inductor 112 and the capacitance of the capacitor 113 can be calculated according to the impedance of the port 121, the impedance of the first output port 104 and an operating frequency of the circuit by using the theory of impedance matching. Moreover, the inductance of the inductor 114 and the capacitance of the capacitor 115 can also be calculated by using such a method.

In some embodiments, the impedance of each of the input port 103, the first output port 104 and the second output port 105 may be a complex number.

In some embodiments, the operating frequency may be 400 MHz, 2.4 GHz, 24 GHz, 60 GHz or another commonly used operating frequency.

Figure 2:
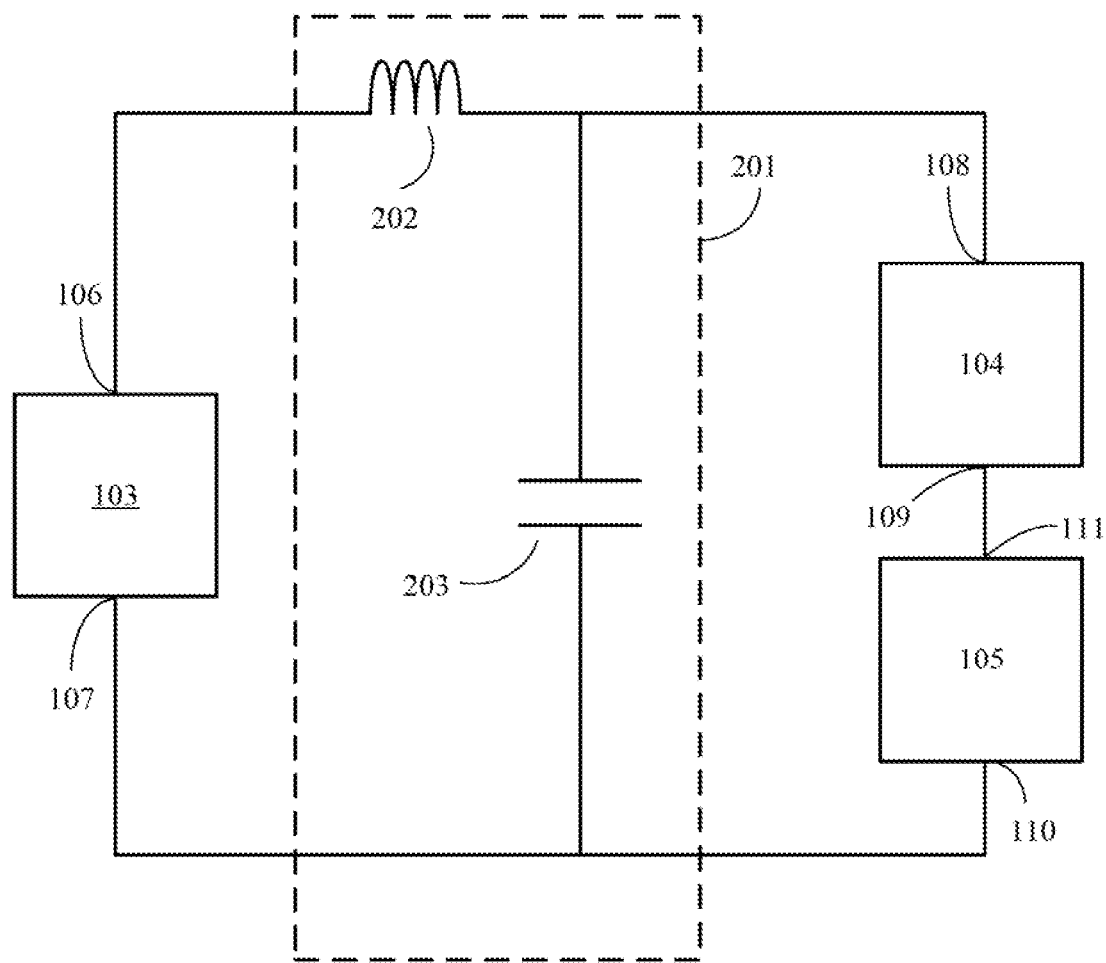
FIG. 2 is a schematic diagram illustrating a structure of a balun device according to one embodiment of this disclosure.

Referring also to FIG. 2, a schematic diagram illustrating a structure of a balun device 200 according to one embodiment of this disclosure is presented. If the balun device 100 is combined with the design of a low-pass filter, the balun device 100 can be simplified into the balun device 200 shown in FIG. 2. Since the two inductors 112, 114 and the input port 103 of the balun device 100 are connected in series, the two inductors 112, 114 of the balun device 100 can be merged into an inductor 202 of the balun device 200, in which the inductance of the inductor 202 is the total inductance of the serially connected inductors 112, 114. The two capacitors 113, 115 of the balun device 100 are also connected in series, such that the two capacitors 113, 115 of the balun device 100 can be merged into a capacitor 203 of the balun device 200, in which the capacitance of the capacitor 203 is the total capacitance of the serially connected capacitors 113, 115.

In some embodiments, the two capacitors 113, 115 of the balun device 100 are not merged into the capacitor 203 of the balun device 200. Meanwhile, a node between the two capacitors 113, 115 is electrically connected to the first reference terminal 109 of the first output port 104 and the second reference terminal 111 of the second output port 105.

Compared to the balun device 100 of the previous embodiment, the balun device 200 of this embodiment has only a single matching circuit 201. The matching circuit 201 includes the above-mentioned inductor 202 and capacitor 203, and the matching circuit 201 is configured to transform and to low-pass filter the single-ended signal into the first signal and the second signal so as to generate the differential signal. The first terminal of the inductor 202 is electrically connected to the input terminal 106, and the second terminal of the inductor 202 is electrically connected to the first terminal of the capacitor 203 and the first output terminal 108. The second terminal of the capacitor 203 is electrically connected to the input single-ended reference terminal 107 and the second output terminal 110.

Figure 3:
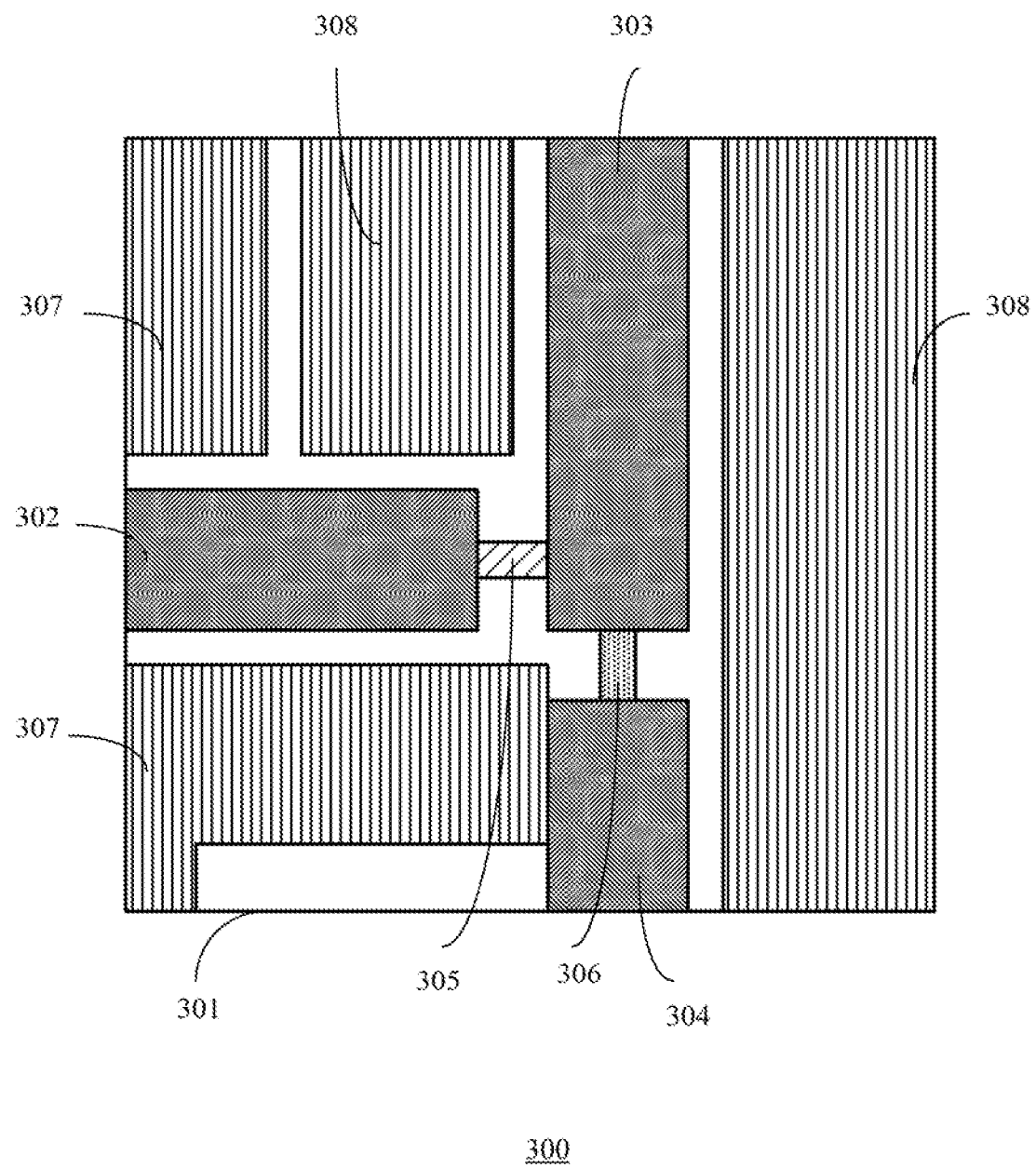
FIG. 3 is a schematic diagram illustrating a printing circuit of a balun device according to one embodiment of this disclosure.

Referring to FIG. 3, a schematic diagram illustrating a printing circuit of a balun device 300 according to one embodiment of this disclosure is presented. The balun device 300 is one embodiment in which the equivalent circuit of the balun device 200 of FIG. 2 is formed into a printed circuit board. The balun device 300 is disposed on a circuit board 301. The balun device 300 includes an input single-ended signal metal layer 302, a first output metal layer 303, a second output metal layer 304, a first passive component 305, a second passive component 306, a input single-ended reference metal layer 307 and a second reference metal layer 308.

The input single-ended signal metal layer 302 receives a single-ended signal relative to the input single-ended reference metal layer 307. The first output metal layer 303 outputs the first signal, and the second output metal layer 304 outputs the second signal. The differential signal is defined as a difference signal between the first signal and the second signal.

In some embodiments, the first output metal layer 303 outputs the first signal relative to the second reference metal layer 308, and the second output metal layer 304 outputs the second signal relative to the second reference metal layer 308. In other words, the second reference metal layer 308 provides a reference voltage level to the first output metal layer 303 and the second output metal layer 304.

The first passive component 305 and the second passive component 306 are configured to match and transform the single-ended signal into a first signal and a second signal. The first passive component 305 has the first terminal and the second terminal. The first terminal of the first passive component 305 is electrically connected to the input single-ended signal metal layer 302, and the second terminal of the first passive component 305 is electrically connected to the first output metal layer 303. The second passive component 306 has the first terminal and the second terminal. The first terminal of the second passive component 306 is electrically connected to the first output metal layer 303, and the second terminal of the second passive component 306 is electrically connected to the second output metal layer 304. In the present embodiment, the first passive component 305 and the second passive component 306 are an inductor and a capacitor respectively, and thus, the balun device 300 has a low pass frequency response.

In some embodiments, the first passive component 305 and the second passive component are surface mount devices.

In some embodiments, the input metal layer 302, the first output metal layer 303, the second output metal layer 304, the input single-ended reference metal layer 307 and the second reference metal layer 308 are disposed on the circuit board 301 using coplanar waveguide techniques.

Figure 4:
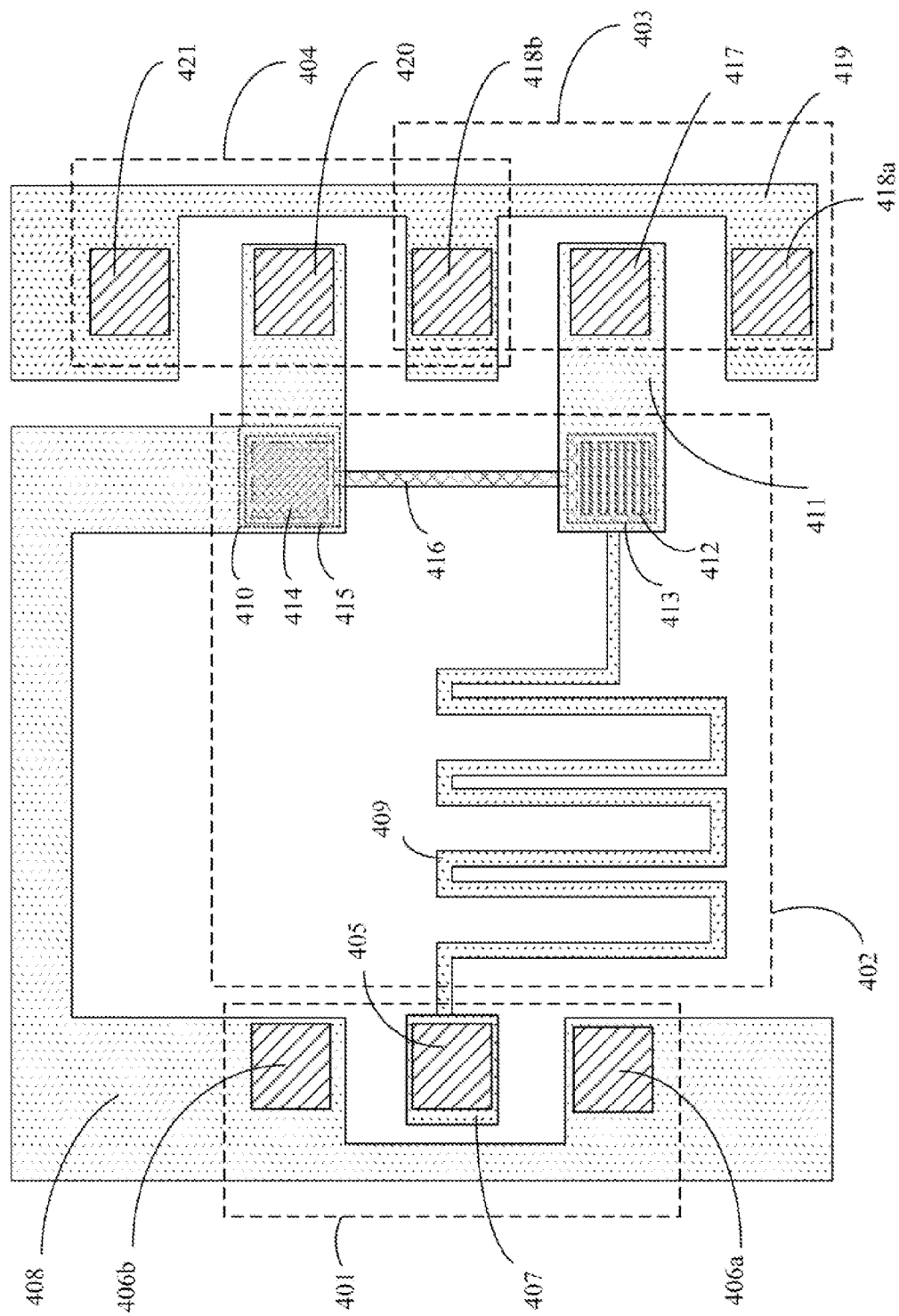
FIG. 4 is a schematic top view illustrating an integrated circuit of a balun device according to one embodiment of this disclosure.

Referring also to FIG. 4, a schematic top view illustrating an integrated circuit of a balun device 400 according to one embodiment of this disclosure is presented. The balun device 400 is one embodiment of the implemented integrated circuit of the balun device 200. The balun device 400 includes an input port 401, a matching circuit 402, a first output port 403 and a second output port 404.

The input port 401 includes an input single-ended signal pad 405 and two input single-ended reference pads 406a, 406b. The input single-ended signal pad 405 is disposed on a metal layer 407 and is configured to receive a single-ended signal relative to the input single-ended reference pad 406a, 406b. The input single-ended reference pads 406a, 406b are disposed on a metal layer 408.

The matching circuit includes an inductor 409 and a capacitor 410, in which the inductor 409 is electrically connected to the metal layer 407 and a metal layer 411. The metal layer 411 is electrically connected to a metal layer 413 at the bottom through a via 412. The metal layer 413 is electrically connected to a capacitor 410 by the metal layer 416.

The capacitor 410 is a metal-insulator-metal capacitor composed by the metal layer 408, an insulation layer 414 and a metal layer 415, in which the metal layer 415 is electrically connected to the metal layer 416.

The first output port 403 includes a first output pad 417 and first reference pads 418a, 418b. The first output pad 417 is disposed on the metal layer 411. The first reference pads 418a, 418b are disposed on the metal layer 419, and therefore, the first reference pads 418a, 418b have the same voltage level. The first output pad 417 is configured to output a first signal.

In some embodiments, the first output pad 417 is configured to output the first signal relative to the first reference pads 418a, 418b.

The second output port 404 includes a second output pad 420, a second reference pad 421 and a first reference pad 418b. The second output port 404 and the first output port 403 share the first reference pad 418b. The second output pad 420 is disposed on the metal layer 408, the second reference metal layer 421 is disposed on the metal layer 419, and the second output pad 420 is configured to output a second signal. The differential signal is defined as a difference signal between the first signal and the second signal.

In some embodiments, the first output pad 420 is configured to output the first signal relative to the first reference pad 421.

In some embodiments, the input single-ended signal pad 405, the input single-ended reference pads 406a, 406b, the first output pad 417, the first reference pads 418a, 418b, the second output pad 420 and the second reference pad 421 are made of conducting material.

Figure 5:
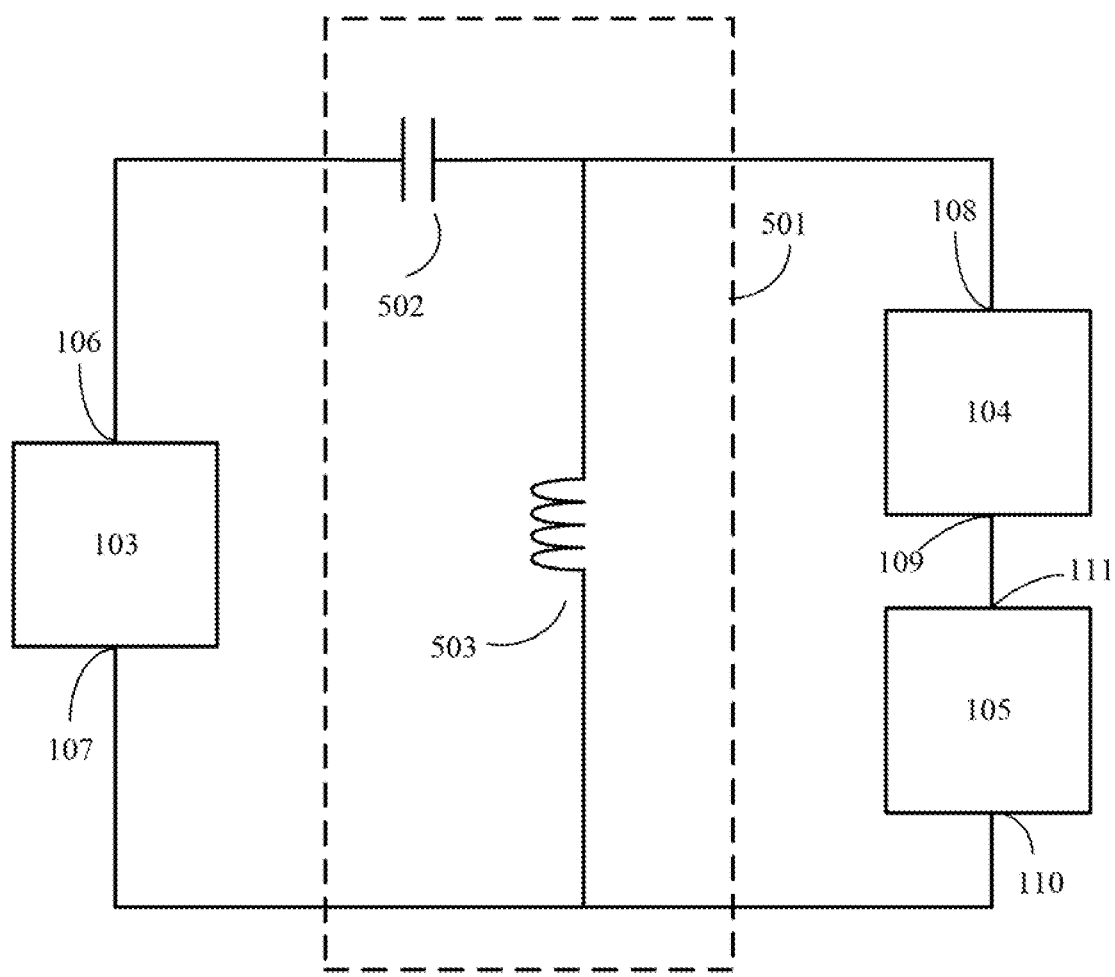
FIG. 5 is a schematic diagram illustrating a balun device according to one embodiment of this disclosure.

Referring to FIG. 5, a schematic diagram illustrating a balun device 500 according to one embodiment of this disclosure is presented. Compared to the balun device 200 of the previous embodiment having a low pass filtering capability, the balun device 500 of this embodiment has a high pass filtering capability, and a matching circuit 501 which is different from the matching circuit 201 of the balun device 200 of the previous embodiment.

The matching circuit 501 includes a capacitor 502 and an inductor 503. The first terminal of the capacitor 502 is electrically connected to the input single-ended signal terminal 106 of the input port 103, and the second terminal of the capacitor 502 is electrically connected to the first terminal of the inductor 503 and the first output terminal 108 of the first output port 104. The second terminal of the inductor 503 is electrically connected to the second output terminal 110 of the second output port 105 and the input single-ended reference terminal 107 of the input port 103.

Reference is also made to FIG. 3. In some embodiments, the first passive component 305 and the second passive component 306 may be a capacitor and an inductor respectively.

In some embodiments, the balun device 500 may be implemented as an integrated circuit.

Figure 6:
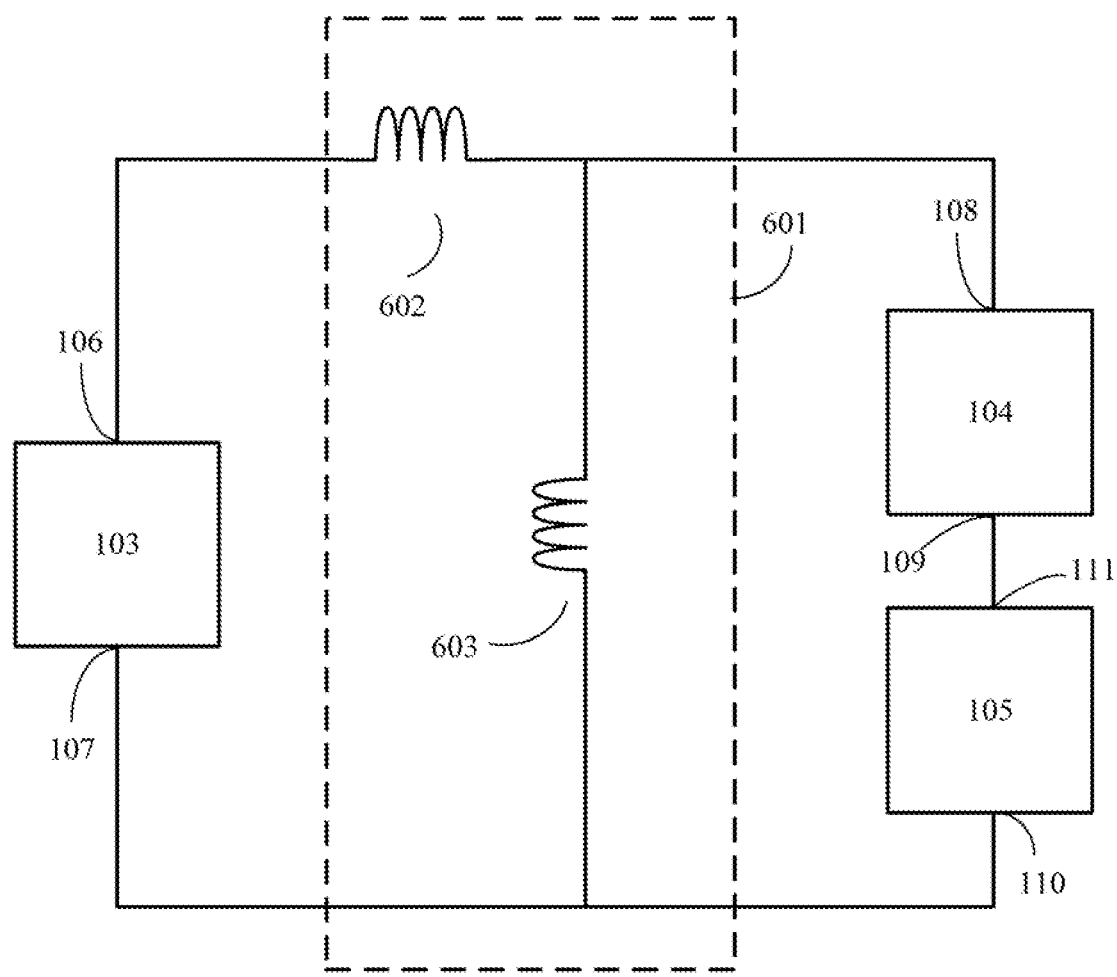
FIG. 6 is a schematic diagram illustrating a balun device according to one embodiment of this disclosure.

Referring to FIG. 6, a schematic diagram illustrating a balun device 600 according to one embodiment of this disclosure is presented. The balun device 600 of this embodiment includes a matching circuit 601 which is different from the matching circuit 201 of the previous embodiment.

The matching circuit 601 includes a first inductor 602 and a second inductor 603. The first terminal of the first inductor 602 is electrically connected to the input single-ended signal terminal 106 of the input port 103, and the second terminal of the first inductor 602 is electrically connected to the first terminal of the second inductor 603 and the first output terminal 108 of the first output port 104. The second terminal of the second inductor 603 is electrically connected to the second output terminal 110 of the second output port 105 and the input single-ended reference terminal 107 of the input port 103.

Reference is also made to FIG. 3. In some embodiments, each of the first passive component 305 and the second passive component 306 may be an inductor.

In some embodiments, the balun device 600 may be implemented as an integrated circuit.

Figure 7:
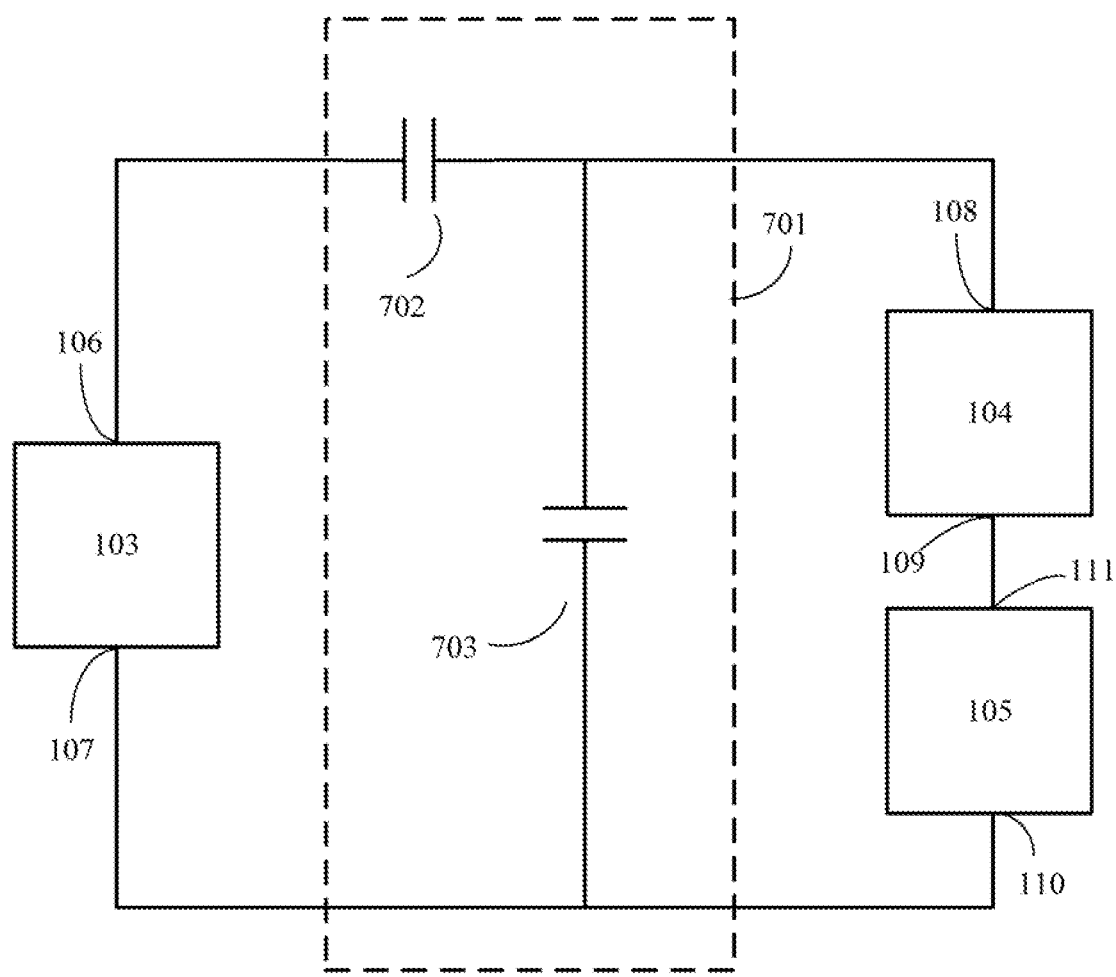
FIG. 7 is a schematic diagram illustrating a balun device according to one embodiment of this disclosure.

Referring to FIG. 7, a schematic diagram illustrating a balun device 700 according to one embodiment of this disclosure is presented. The balun device 700 of this embodiment includes a matching circuit 701 which is different from the matching circuit 201 of the balun device 200 of the previous embodiment.

The matching circuit 701 includes a first capacitor 702 and a second capacitor 703. The first terminal of the first capacitor 702 is electrically connected to the input single-ended signal terminal 106 of the input port 103, and the second terminal of the first capacitor 702 is electrically connected to the first terminal of the second capacitor 703 and the first output terminal 108 of the first output port 104. The second terminal of the second capacitor 703 is electrically connected to the second output terminal 110 of the second output port 105 and the input single-ended reference terminal 107 of the input port 103.

Reference is also made to FIG. 3. In some embodiments, each of the first passive component 305 and the second passive component 306 may be a capacitor.

In some embodiments, the balun device 700 may be implemented as an integrated circuit.

Figure 8A:
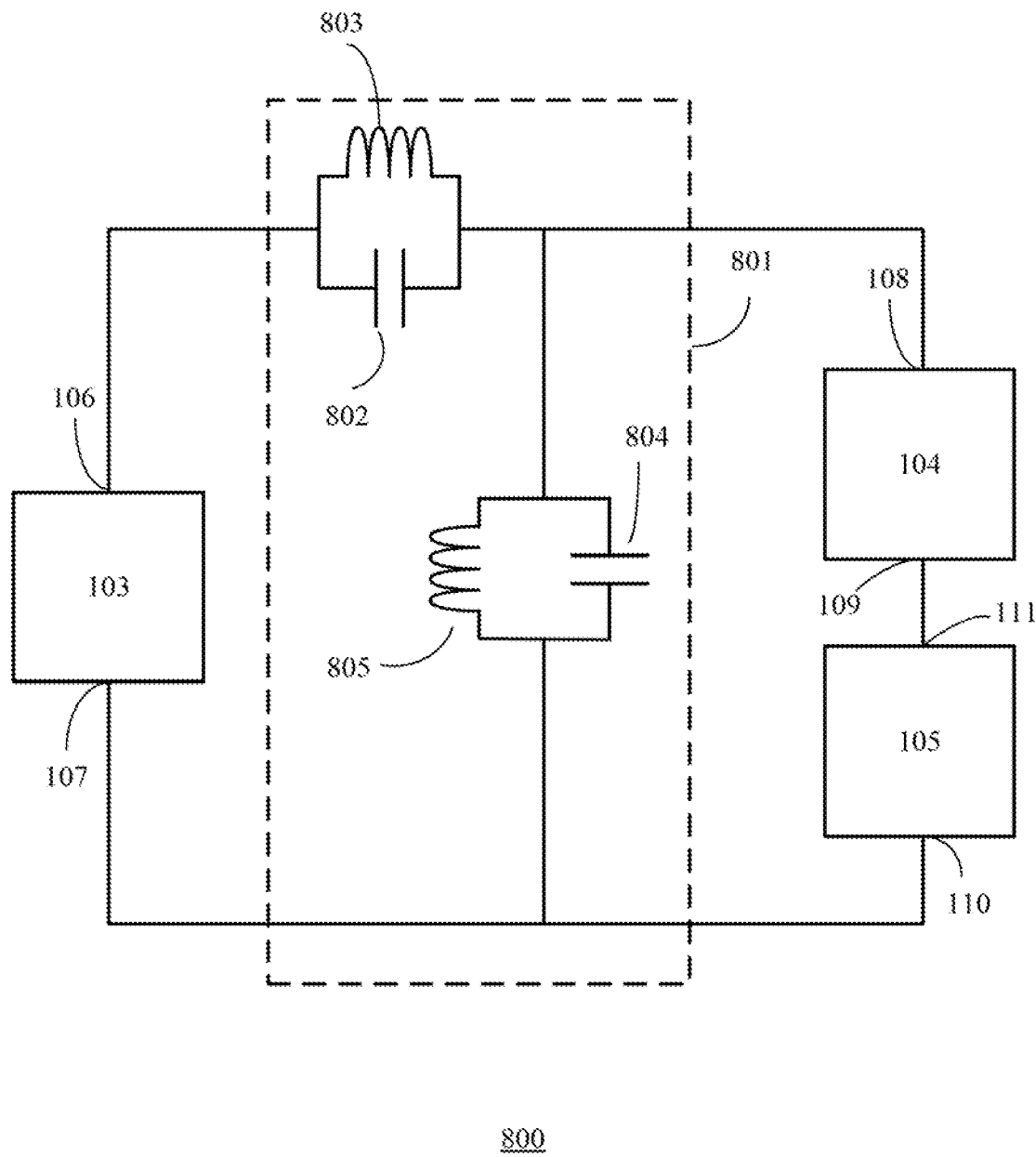
FIG. 8A is a schematic diagram illustrating a balun device according to one embodiment of this disclosure.

Referring to FIG. 8A, a schematic diagram illustrating a balun device 800 according to one embodiment of this disclosure is presented. Compared to the balun device 200 of the previous embodiment having the low pass filtering response, the balun device 800 of this embodiment has a band pass filtering response, and a matching circuit 801 which is different from the matching circuit 201 of the balun device 200 of the previous embodiment.

The matching circuit 801 includes a first capacitor 802, a first inductor 803, a second capacitor 804 and a second inductor 805. The first terminal of the first inductor 803 is electrically connected to the input single-ended signal terminal 106 of the input port 103, and the second terminal of the first inductor 803 is electrically connected to the first terminal of the second inductor 805 and the first output terminal 108 of the first output port 104. The first capacitor 802 is connected to the first inductor 803 in parallel. The second terminal of the inductor 805 is electrically connected to the second output terminal 110 of the second output port 105, and the second capacitor 804 is electrically connected to the second inductor 805 in parallel.

Reference is also made to FIG. 3. In some embodiments, the first passive component 305 is an inductor connected to a capacitor in parallel, and the second passive component 306 is another inductor connected to a capacitor in parallel.

In some embodiments, the balun device 800 may be implemented as an integrated circuit.

Figure 8B:
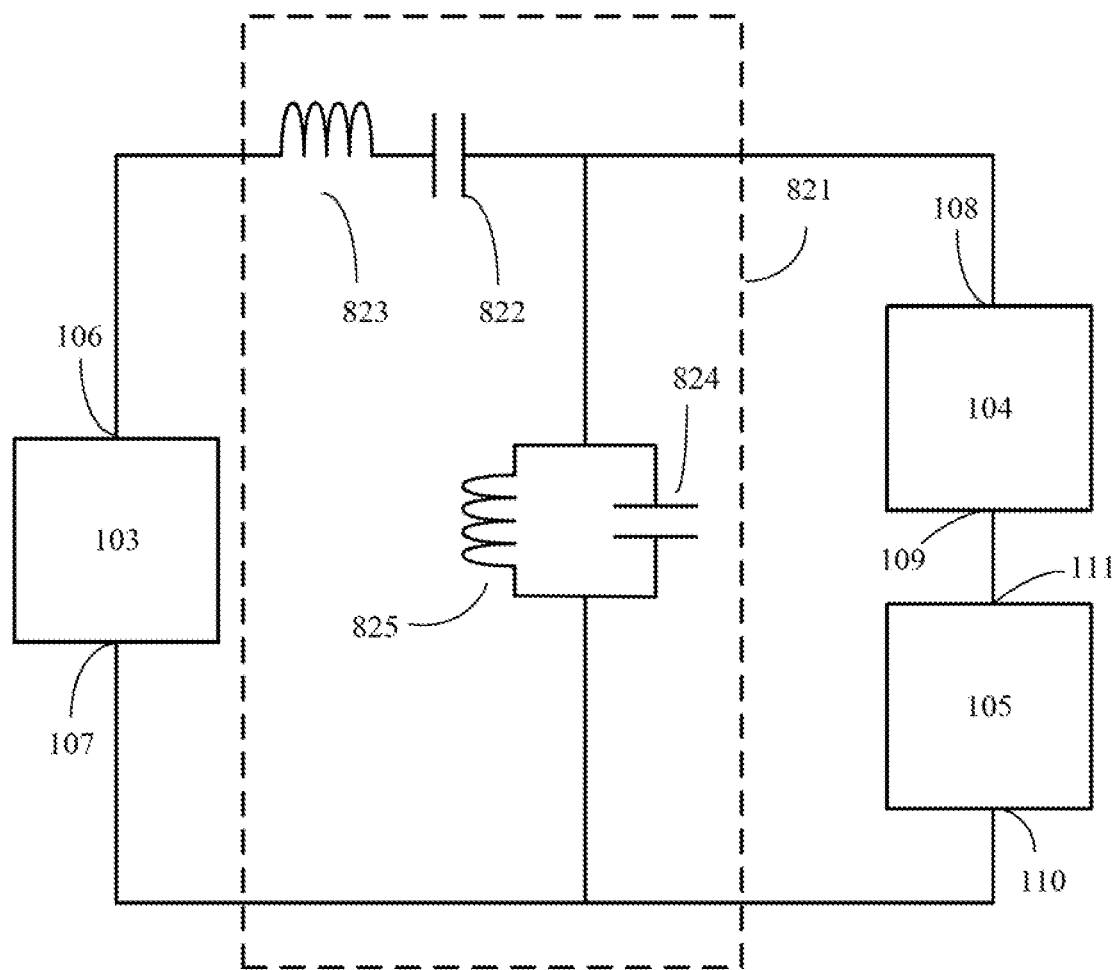
FIG. 8B is a schematic diagram illustrating a balun device according to one embodiment of this disclosure.

Referring to FIG. 8B, a schematic diagram illustrating a balun device 820 according to one embodiment of this disclosure is presented. Compared to the balun device 200 of the previous embodiment having the low pass filtering response, the balun device 820 of this embodiment has a band pass filtering response, and a matching circuit 821 which is different from the matching circuit 201 of the balun device 200 of the previous embodiment.

The matching circuit 821 includes a first capacitor 822, a first inductor 823, a second capacitor 824 and a second inductor 825. The first terminal of the first inductor 823 is electrically connected to the input single-ended signal terminal 106 of the input port 103, and the second terminal of the first inductor 823 is electrically connected to the first terminal of the first capacitor 822. The second terminal of the first capacitor 822 is electrically connected to the first terminal of the inductor 825. The second terminal of the inductor 825 is electrically connected to the second output terminal 110 of the second output port 105, and the second capacitor 824 is electrically connected to the second inductor 825 in parallel.

Reference is also made to FIG. 3. In some embodiments, the first passive component 305 is an inductor connected to a capacitor in series, and the second passive component 306 is another inductor connected to a capacitor in parallel.

In some embodiments, the balun device 820 may be implemented as an integrated circuit.

Figure 9:
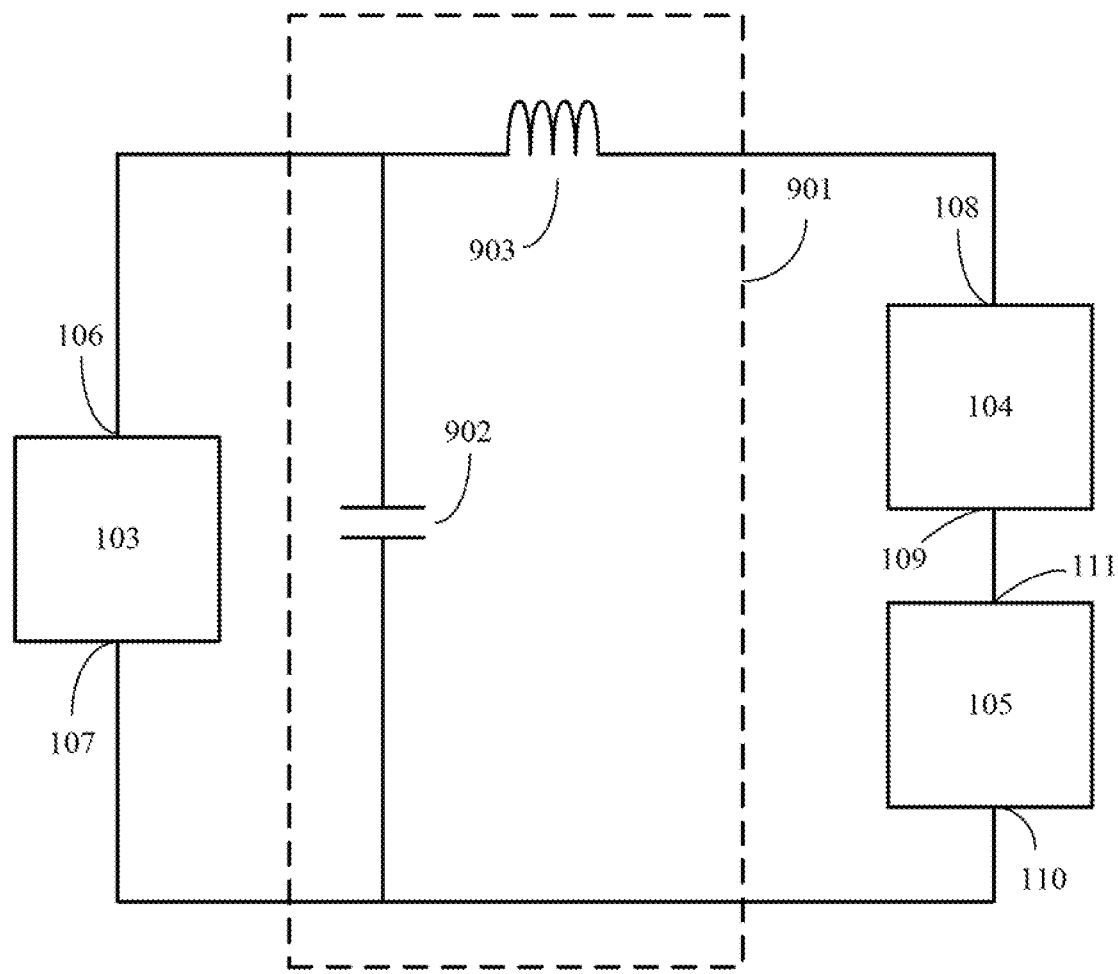
FIG. 9 is a schematic diagram illustrating a balun device according to one embodiment of this disclosure.

Referring to FIG. 9, a schematic diagram illustrating a balun device 900 according to one embodiment of this disclosure is presented. The balun device 900 includes a matching circuit 901 which is different from the matching circuit 201 of the balun device 200 of the previous embodiment.

The matching circuit 901 includes a capacitor 902 and an inductor 903. The first terminal of the capacitor 902 is electrically connected to the input single-ended signal terminal 106 of the input port 103 and the first terminal of the inductor 903, and the second terminal of the capacitor 902 is electrically connected to the input single-ended reference terminal 107 of the input port 103 and the first output terminal 110 of the second output port 105. The second terminal of the inductor 903 is electrically connected to the first output terminal 108 of the first output port 104.

In some embodiments, the capacitor 902 may be replaced with an inductor, a capacitor connected to an inductor in parallel or a capacitor connected to an inductor in series In some embodiments, the inductor 903 may be replaced with a capacitor or a capacitor connected to an inductor in parallel or a capacitor connected to an inductor in series.

In some embodiments, the balun device 900 may be implemented as an integrated circuit.

Figure 10:
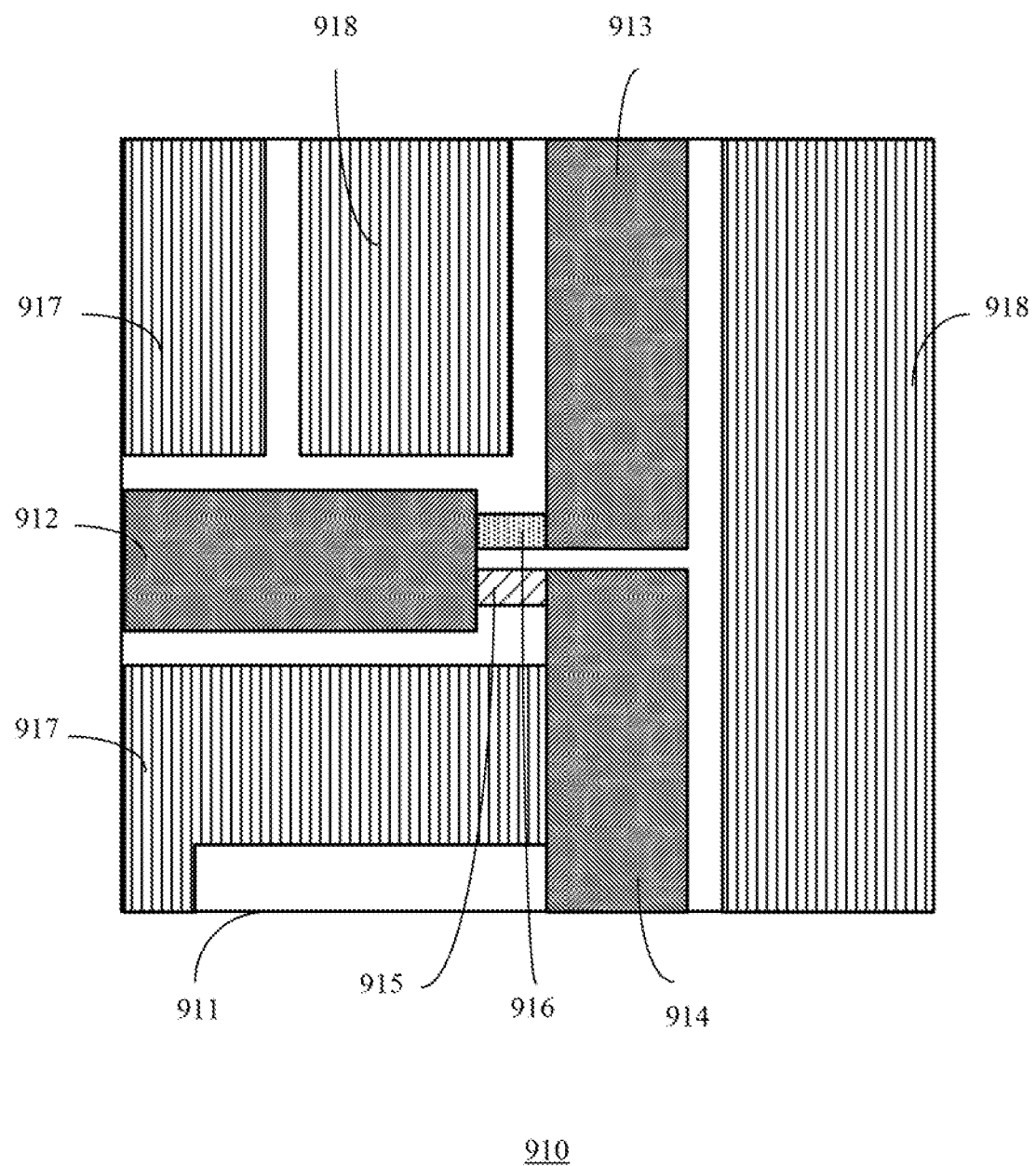
FIG. 10 is a schematic diagram illustrating a printing circuit of a balun device according to one embodiment of this disclosure.

Referring also to FIG. 10, a schematic diagram illustrating a printing circuit of a balun device 910 according to one embodiment of this disclosure is presented. The balun device 910 is one embodiment in which the equivalent circuit of the balun device 900 of FIG. 9 is formed into a printed circuit board. The balun device 910 is disposed on a circuit board 911. The balun device 910 includes an input single-ended signal metal layer 912, a first output metal layer 913, a second output metal layer 914, a first passive component 915, a second passive component 916, an input single-ended reference metal layer 917 and a second reference metal layer 918. In the present embodiment, the first passive component 915 is a capacitor, and the second passive component 916 is an inductor.

Compared to the balun device 300 of FIG. 3, the first passive component 915 of the balun device 910 of this embodiment is electrically connected to the input single-ended signal metal layer 912 and the second output metal layer 914. The second passive component 916 is electrically connected to the input metal single-ended signal layer 912 and the first output metal layer 913.

In some embodiments, the first passive component 915 may be an inductor, a capacitor connected to an inductor in parallel or a capacitor connected to an inductor in series, and the second passive component 916 may be a capacitor, a capacitor connected to an inductor in parallel or a capacitor connected to an inductor in series.

According to the embodiments mentioned above, the balun devices of the present disclosure can reduce the number of the inductors so as to reduce overall power consumption and the area occupied by the inductors.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A balun device, configured to transform a single-ended signal into a differential signal, comprising:
    a first output port comprising a first output terminal;
    a second output port comprising a second output terminal;
    an input port, comprising:
        an input single-ended signal terminal; and
        an input single-ended reference terminal, wherein the input single-ended reference terminal is electrically connected to the second output terminal, and the input single-ended signal terminal is configured to receive the single-ended signal relative to the input single-ended reference terminal; and
    a matching circuit electrically connected to the first output port, the second output port and the input port, wherein the matching circuit is configured to match and transform the single-ended signal into the differential signal outputted between the first output port and the second output port;
    wherein the first output port further comprises a first output reference terminal, and the second output port further comprises a second output reference terminal, in which the first output reference terminal is electrically connected to the second output reference terminal, the first output reference terminal is not electrically connected to the input single-ended signal terminal, and the first output reference terminal and the second output reference terminal are configured to provide the first output terminal and the second output terminal a reference voltage level respectively.

2. The balun device of claim 1, wherein the matching circuit comprises:
    an inductor comprising a first terminal and a second terminal, wherein the first terminal of the inductor is electrically connected to the input single-ended signal terminal;
    a first capacitor comprising a first terminal and a second terminal, wherein the first terminal of the first capacitor is electrically connected to the second terminal of the inductor and the first output terminal, and the second terminal of the first capacitor is electrically connected to the first output reference terminal of the first output port; and
    a second capacitor comprising a first terminal and a second terminal, wherein the first terminal of the second capacitor is electrically connected to the second terminal of the first capacitor, and the second terminal of the second capacitor is electrically connected to the second output port and the input single-ended reference terminal.

3. The balun device of claim 1, wherein the matching circuit comprises:
    a first passive component comprising a first terminal and a second terminal, wherein a first terminal of the first passive component is electrically connected to the input single-ended signal terminal; and
    a second passive component comprising a first terminal and a second terminal, wherein the first terminal of the second passive component is electrically connected to the second terminal of the first passive component and the first output terminal, and the second terminal of the second passive component is electrically connected the second output terminal and the input single-ended reference terminal of the input port.

4. The balun device of claim 3, wherein the first passive component is a first inductor, a first capacitor or a series connection of the first inductor and the first capacitor, and the second passive component is a second inductor, a second capacitor or a parallel connection of the second inductor and the second capacitor.

5. The balun device of claim 1, wherein the matching circuit comprises:
    a first passive component comprising a first terminal and a second terminal, wherein a first terminal of the first passive component is electrically connected to the input single-ended signal terminal, and the second terminal of the first passive component is electrically connected to the second output terminal and the input single-ended reference terminal; and
    a second passive component comprising a first terminal and a second terminal, wherein the first terminal of the second passive component is electrically connected to the first terminal of the first passive component, and the second terminal of the second passive component is electrically connected the first output terminal.

6. The balun device of claim 5, wherein the first passive component is a first inductor, a first capacitor or a parallel connection of the first inductor and the first capacitor, and the second passive component is a second inductor, a second capacitor or a series connection of the second inductor and the second capacitor.

7. A balun device disposed on a circuit board and configured to transform a single-ended signal into a differential signal, wherein the balun device comprises:
    an input single-ended signal metal layer;

an input single-ended reference metal layer, wherein the input single-ended metal layer is configured to receive the single-ended signal relative to the input single-ended reference metal layer;

a first output metal layer;

a second output metal layer, electrically connected to the input single-ended reference metal layer;

a first passive component comprising a first terminal and a second terminal, wherein the first terminal of the first passive component is electrically connected to the input single-ended signal metal layer, the second terminal of the first passive component is electrically connected to the first output metal layer; and a second passive component comprising a first terminal and a second terminal, wherein the first terminal of the second passive component is electrically connected to the first output metal layer, and the second terminal of the second passive component is electrically connected to the second output metal layer and the input single-ended reference metal layer;

wherein the first passive component and the second passive component are configured to match and transform the single-ended signal into the differential signal outputted by the first output metal layer and the second output metal layer;

wherein the first output metal layer further comprises a first output reference terminal, and the second output metal layer further comprises a second output reference terminal, in which the first output reference terminal is electrically connected to the second output reference terminal, the first output reference terminal is not electrically connected to the input single-ended signal terminal, and the first output reference terminal and the second output reference terminal are configured to provide the first output terminal and the second output terminal a reference voltage level respectively.

8. The balun device of claim 7, wherein the first passive component is a first inductor, a first capacitor or a series connection of the first inductor and the first capacitor, and the second passive component is a second inductor, a second capacitor or a parallel connection of the second inductor and the second capacitor.

9. A balun device disposed on a circuit board and configured to transform a single-ended signal into a differential signal, wherein the balun device comprises:

an input single-ended signal metal layer;

an input single-ended reference metal layer, wherein the input single-ended signal metal layer is configured to receive the single-ended signal relative to the input single-ended reference metal layer;

a first output metal layer;

a second output metal layer, electrically connected to the input single-ended reference metal layer;

a first passive component comprising a first terminal and a second terminal, wherein the first terminal of the first passive component is electrically connected to the input single-ended signal metal layer, and the second terminal of the first passive component is electrically connected to the second output metal layer and the single-ended reference metal layer; and a second passive component comprising a first terminal and a second terminal, wherein the first terminal of the second passive component is electrically connected to the input single-ended signal metal layer, and the second terminal of the second passive component is electrically connected to the first output metal layer;

wherein the first passive component and the second passive component are configured to match and transform the single-ended signal into the differential signal outputted by the first output metal layer and the second output metal layer;

wherein the first output metal layer further comprises a first output reference terminal, and the second output metal layer further comprises a second output reference terminal, in which the first output reference terminal is electrically connected to the second output reference terminal, the first output reference terminal is not electrically connected to the input single-ended signal terminal, and the first output reference terminal and the second output reference terminal are configured to provide the first output terminal and the second output terminal a reference voltage level respectively.

10. The balun device of claim 9, wherein the first passive component is a first inductor, a first capacitor or a parallel connection of the first inductor and the first capacitor, and the second passive component is a second inductor, a second capacitor or a series connection of the second inductor and the second capacitor.

* * * * *